United States Patent [19]

Fraas et al.

[11] Patent Number: 5,312,521

[45] Date of Patent: May 17, 1994

[54] COMPACT DC ELECTRIC POWER GENERATOR USING LOW BANDGAP THERMOPHOTOVOLTAIC CELL STRINGS WITH A HYDROCARBON GAS BURNER FITTED WITH A REGENERATOR

[76] Inventors: Arthur P. Fraas, 1040 Scenic Dr., Knoxville, Tenn. 37919; Robert M. Fraas, 38120 Boulder Creek Dr., Palm Desert, Calif. 92260

[21] Appl. No.: 906,452

[22] Filed: Jun. 30, 1992

[51] Int. Cl.$^5$ ................... H01L 31/052; H01L 31/058
[52] U.S. Cl. ................................... 136/253; 136/246; 431/100; 431/115
[58] Field of Search ................. 136/246, 253; 431/115, 431/100

[56] References Cited

U.S. PATENT DOCUMENTS

| | | | |
|---|---|---|---|
| 4,069,812 | 1/1978 | O'Neill | 136/246 |
| 4,776,895 | 10/1988 | Goldstein | 136/253 |
| 4,976,606 | 12/1990 | Nelson | 431/79 |
| 5,091,018 | 2/1992 | Fraas et al. | 136/246 |
| 5,096,505 | 3/1992 | Fraas et al. | 136/246 |
| 5,118,361 | 6/1992 | Fraas et al. | 136/246 |
| 5,123,968 | 6/1992 | Fraas et al. | 136/246 |

OTHER PUBLICATIONS

A. C. Day et al, *Conference Record, 21st IEEE Photovoltaic Specialists Conf.* (May 1990), pp. 1320–1325.

Fraas, "Heat Exchanger Design Operating on Radiant Energy", Wiley-Interscience Publication, pp. 365–382 (U.S.A. 1989).

Fraas, "Characteristics of Heat Sources", Engineering Evaluation of Energy Systems, pp. 96–125 (U.S.A. 1982).

Pelka et al., "Natural Gas-Fired Thermophotovoltaic System", Proceedings of the 32nd International Power Sources, pp. 110–123 (U.S.A. 1986).

Morgan et al., "Radioisotope Thermal Photovoltaic Application of the GaSb Solar Cell", NASA SPRAT Conference, pp. 349–358 (U.S.A. 1989).

Tester et al., "Comparative Performance Characteristics of Cylindrical...", American Society of Mechanical Engineers, pp. 1–3 (U.S.A. 1974).

Fraas, "Effects of Directed and Kinetic Energy Weapons on Spacecraft", Oak Ridge National Laboratory, pp. 1–76 (U.S.A. 1986).

Fraas et al., "Summary of the Research and Development Effort on Ceramic Gas Turbines", Oak Ridge National Laboratories, pp. 1–33 (U.S.A. 1977).

Howe et al., "The Characteristics of Atmospheric-Type Burners When Used with Natural Gas", Transactions of the A.S.M.E., pp. 673–677 (U.S.A. 1940).

A. P. Fraas, "Design and Development Tests of Direct-Condensing Potassium Radiators", USAEC Report Conf-651026 (U.S.A. 1965).

(List continued on next page.)

*Primary Examiner*—Aaron Weisstuch
*Attorney, Agent, or Firm*—James Creighton Wray

[57] ABSTRACT

Multiple low bandgap $Ga_{1-x}In_xSb$ photovoltaic cell strings are mounted around the perimeter of a cylinder parallel to a central cylindrical emitter, or radiator. These cell strings face radially inward to receive infrared (IR) radiation from the emitter, and efficiently convert this radiation into DC electric power. Reflecting surfaces are positioned on either side of each cell string to concentrate most of the IR radiation on the photovoltaic cells and return much of the balance to the emitter. The inside of the emitter is heated by flames from small gas jets from a central burner tube with a jet pattern somewhat similar to that of a gas kitchen stove. A uniform temperature along the length of the emitter is maintained by employing a gas jet hole pattern that produces a staged addition of fuel in a special burner design. Regenerative air heating is employed to increase the flame temperature and avoid large energy losses in the stack gas. Both measures increase the efficiency and reduce the size and cost of the system. The resultant unit is a compact, quiet, light weight, DC electric power source.

13 Claims, 3 Drawing Sheets

OTHER PUBLICATIONS

O'Neil et al., "Development of a Fresnel Lens Gallium Arsenide . . . ", Phase I Final Report, NASA SBIR Contract NAS3-24871, (1986).

Piszczor et al., "The Mini-Dome Fresnel Lens . . . ", 21st IEEE Photovoltaic Specialist Conference, pp. 1271-1276 (1990).

Fraas et al., "Over 30% Efficient Tandem Gallium Solar Cells . . . ", Optoelectronics, vol. 5, No. 2, pp. 297-310 (1990).

Fraas et al., "Advanced Photovoltaic Power Systems . . . ", 3rd Annual Symposium of Univ. of Arizona/NASA, pp. II-9-II-21 (1992) (Feb.).

Kittl et al., "Design Analysis of TPV-Generator System", Proc. 25th Annual Power Sources Conf., pp. 106-110 (1972).

Woolf, L. D., "Optimum Efficiency of Single & Multiple Bandgap Cells . . . ", Solar Cells, 19, pp. 19-20 (1986-1987).

Fraas, "Magneto-Hydrodynamic Systems", Engineering Evaluation of Energy Systems, pp. 437-461 (1982).

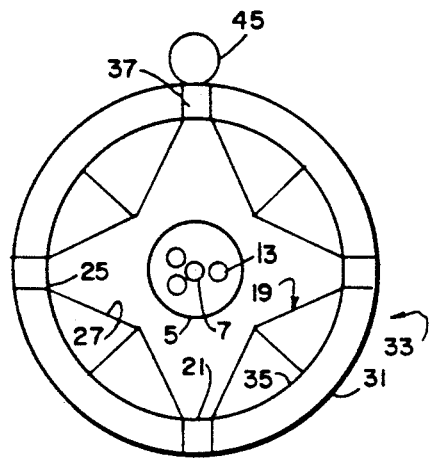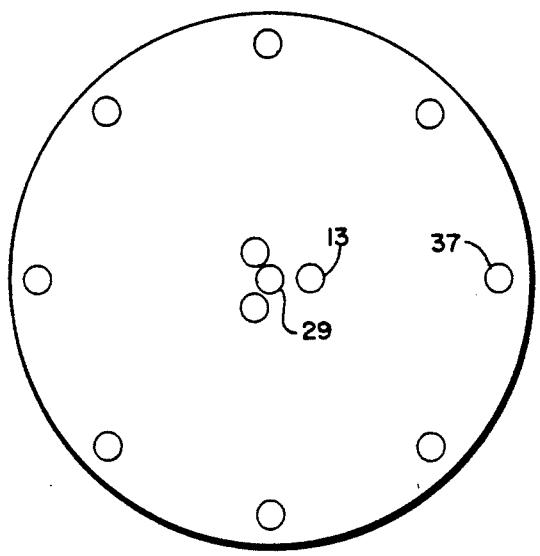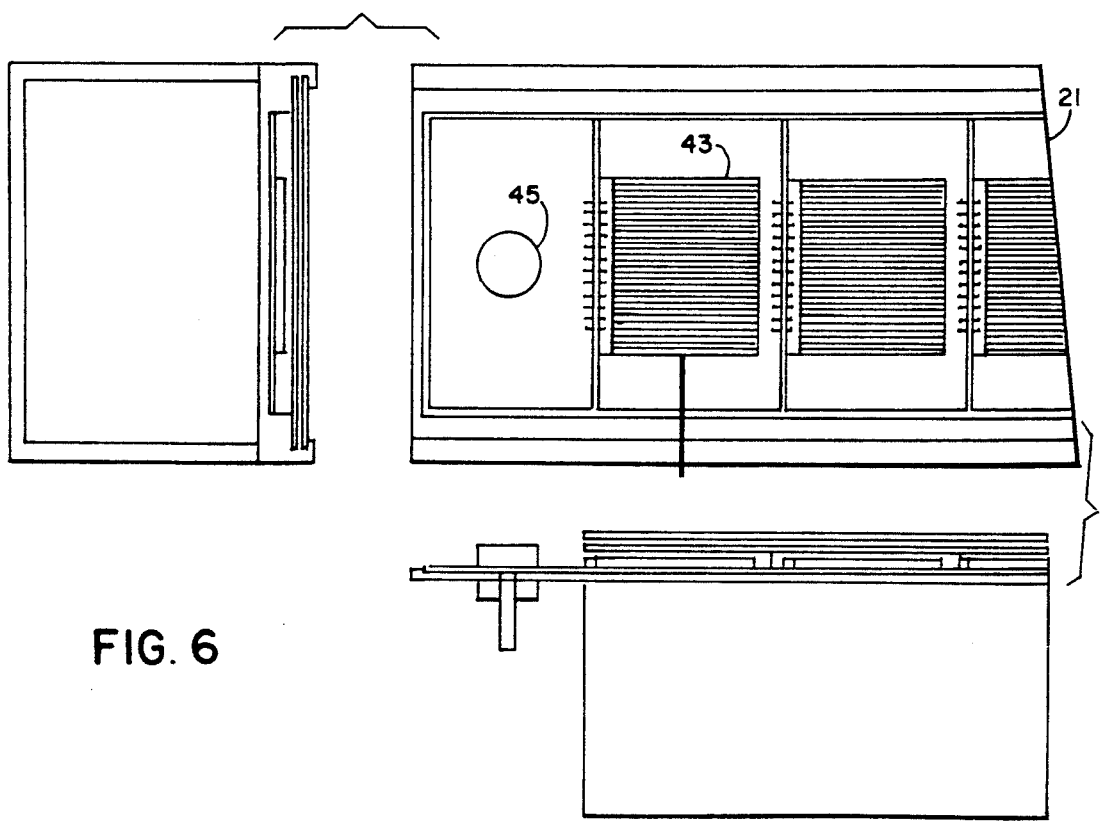

COMPACT DC ELECTRIC POWER GENERATOR USING LOW BANDGAP THERMOPHOTOVOLTAIC CELL STRINGS WITH A HYDROCARBON GAS BURNER FITTED WITH A REGENERATOR

BACKGROUND OF THE INVENTION

The present invention relates to thermophotovoltaics and more particularly to the use of new low bandgap $Ga_{1-x}In_xSb$ photovoltaic cells sensitive to IR radiation down to 2.0 μm. These new cells allow the use of lower temperature emitters. (FIG. 7 from Ref. 1 shows the effects of emitter temperature on the wave length of the emitted radiation.) Previous silicon cells required the operation of IR emitters at much higher temperatures where materials problems have severely limited the emitter lifetime. Further, to obtain emitter temperatures in the 1300 to 1800 K range requires even higher flame temperatures, and flame temperatures above about 1300 K are extremely difficult to achieve without the use of oxygen (which is unacceptably expensive) or preheating of the combustion air, usually by regeneration. (See Ref. 2, Chapters 5 and 16.) Thus to obtain a significant fraction of the combustion energy in usable IR radiation, the unit must make use of regenerative heating of the combustion air together with low bandgap cells. These new low bandgap cells may be wired in series strings and combined with a novel burner/emitter designed to give a nearly uniform temperature along its length in order to maximize cell string current and power output. The cell strings and burner/emitter are integrated with IR reflectors to form a compact, quiet, light-weight DC electric power supply which can be used for off-grid electric power for recreational vehicles, mountain cabins, or third world village homes. In colder climates, the unit can be used for heating as well as electric power.

One version of the unit is cylindrical in shape with a diameter of 5 to 10 in. and a height of 18 to 36 in. See FIGS. 2 to 6. Depending on the number of cell strings provided with this unit, it is designed to generate from 300 W to 1 kW.

Various attempts to fabricate practical and economically interesting thermophotovoltaic (TPV) power generators have been reported over the years. In 1986, D. G. Pelka, A. Santos, and W. W. Yuen described both earlier efforts and their attempt to design and fabricate a natural-gas-fired thermophotovoltaic system (Ref. 3). Their desk-top-sized unit used a rotating drum with a porous particle bed serving as the high temperature emitter operating at >2000 K. Silicon TPV cells were mounted inside the rotating drum. They noted that for silicon cells and an emitter temperature <2600 K, over 76% of the black body radiation is in unusably long wavelengths (>1.1 μm) energy. Their design was complicated by their attempt to design a very high temperature emitter as required by the silicon TPV cells. Without very high temperature emitters, TPV systems based on silicon cells are both inefficient and operate at low power densities. Selective emitters based on rare earth oxides have been described (U.S. Pat. No. 4,976,606 Ref. 4) which improve efficiencies but still suffer from low power densities at practical emitter temperatures.

In 1989, L. M. Fraas et. al. described a new GaSb photovoltaic cell sensitive in the IR out to 1.8 μm. This cell was designed to be used with concentrated sunlight as an infrared booster cell in tandem with GaAs solar cells (U.S. Pat. No. 5,096,505, Ref. 5). In 1989, M. D. Morgan, W. E. Horne, and A. C. Day (NASA SPRAT conference, Ref. 6) proposed using GaSb cells in combination with a radioisotope thermal generator for space electric power, and in 1991 O. L. Doellner proposed using GaSb cells looking at jet engine plumes to replace alternators on jet aircraft (Ref. 7). As of this writing, neither Morgan nor Doellner has built a TPV generator using GaSb cells.

It now seems timely to take a fresh approach to the design of a compact gas-fired TPV generator. It is clear that the longer wavelength response of the GaSb cell will allow the use of lower temperature emitters. However, several problems must still be solved. First, when photovoltaic cells are wired together in series in order to generate a required voltage, e.g. 12 V, it is important that they each receive the same amount of IR radiation. Otherwise, the cell string current is limited by the cell with the lowest IR generated current. This translates to a requirement to tailor the temperature profile over the length of the emitter. A uniform temperature would give a first approximation, but end effects will probably require special handling of both the shape of the end reflectors and the burner jet pattern to obtain the desired uniform radiation energy input along the length of each cell string. Second, the energy conversion efficiency is not only controlled by the TPV cell bandgap and response to the IR; exhaust gas heat losses up the stack will be very large without provision for regenerative heating of the combustion supply air by the exhaust gas. This will also increase the flame temperature and permit higher emitter temperatures, which will in turn increase the cell output per unit of cell area, and thus reduce the size, weight, and cost. Third, the low bandgap TPV cell temperature must be maintained near room temperature in order to preserve high cell conversion efficiency. Fourth, the IR energy from the emitter has to be efficiently coupled to the TPV cell strings. Fifth, it may be desirable to tune the low bandgap response even somewhat further into the infrared.

SUMMARY OF THE INVENTION

A major feature of the present invention resides in the burner/emitter/regenerator design. The emitter will consist of a long tube surrounding and coaxial with a central burner tube. Note that a simple blow-torch-type of burner would not give the nearly uniform axial and circumferential emitter surface temperature distribution required. Instead, the burner design chosen employs a multiplicity of small flames similar to those in such different applications as the gas burners of a kitchen stove or in the base of the liquid-fueled rocket engines of the NASA Saturn launch vehicle. In our design, as in a Bunsen burner, the fuel gas is mixed with a small amount of air (the primary air) at ambient temperature. This mixture enters one end of the burner tube and jets from small ports in the burner tube wall to form a pattern of small flames in the annulus between the burner tube and the inner wall of the emitter. The secondary air, the bulk of the air required for combustion, flows into this annular combustion chamber after being preheated in the regenerator, while the hot exhaust gas leaving the burner-emitter flows upward through its set of passages in the coaxial regenerator. The combustion gases heat the emitter to provide the IR energy radiated to the TPV cells.

A further feature of this invention is to locate the TPV cell strings so that they look radially inward at the emitter with reflector panels on either side to concentrate as much as possible of the IR rays on the cell strings and return much of the balance to the emitter. These panels can be contoured to concentrate most of the IR radiation from the emitter and focus it on the cells. The precepts involved in the design of the contour are basically similar to those employed in the design of reflectors for the red-hot radiator tubes for space power plants and for tubes in solar-heated hot water heaters as described in Refs. 8 and 9. While the 98 to 99% reflectivity of gold makes it an ideal candidate, it is inherently too expensive for this application, but Alzak finish aluminum (the material used in reflectors for flashlights) has a reflectivity of about 90%, and has given excellent service in tests of radiators for space power plants, and for solar-radiation-heated tubes for residential hot water heaters (Refs. 8 and 9).

The effectiveness of the emitter-reflector combination can be improved by painting a narrow, vertical, black (high-emissivity), strip on a white (low-emissivity), alumina emitter directly across from each cell string. This makes it possible to design the reflector so that it focuses a greater fraction of the radiation on the cell string. Unfortunately, this greatly reduces the amount of energy emitted from a given temperature of the emitter. Another approach to increasing the efficiency of the emitter-reflector combination is to incorporate small but deep axial grooves in the surface of the emitter. This will not only increase the emissivity via the cavity effect, but by using the configuration of FIG. 8 it can serve to columnate the radiation so that it is not emitted isotropically, but is mostly in the direction normal to the face of the groove openings, i.e., toward the photovoltaic cell string.

Another feature of the invention resides in the design of the TPV cell string for near-room-temperature operation. The cell string is mounted on a heat sink allowing for back-side air cooling. A multipane glass window is located in front of the cell string to minimize heating by natural convection of the air in the region between the cells and the emitter. The front of the glass window is optically coated to reflect long wavelength IR ($>2$ $\mu$m) but to transmit short wavelength IR.

While air circulation through the system could be accomplished by natural thermal convection, the gas passages can be substantially reduced in size to give a much smaller unit if a fan is provided. This can supply both the air for the combustion system and cooling air for the TPV cells to prevent them from overheating.

Yet another feature is the possible use of photovoltaic materials other than GaSb that may have more favorable properties. For example, $Ga_{1-x}In_xSb$ cells respond to somewhat longer wavelengths than GaSb.

These and other features of the invention will become more fully apparent from the claims, and from the description as it proceeds in conjunction with appended drawings.

BRIEF DESCRIPTION OF THE DRAWINGS

FIG. 4 shows a horizontal cross section through the burner/radiator/TPV cell region.

FIG. 5 shows a horizontal cross section through the top of the regenerator.

FIG. 6 shows top, side, and end views of the TPV cell string assembly.

DETAILED DESCRIPTION OF PREFERRED EMBODIMENTS

Figure 1:
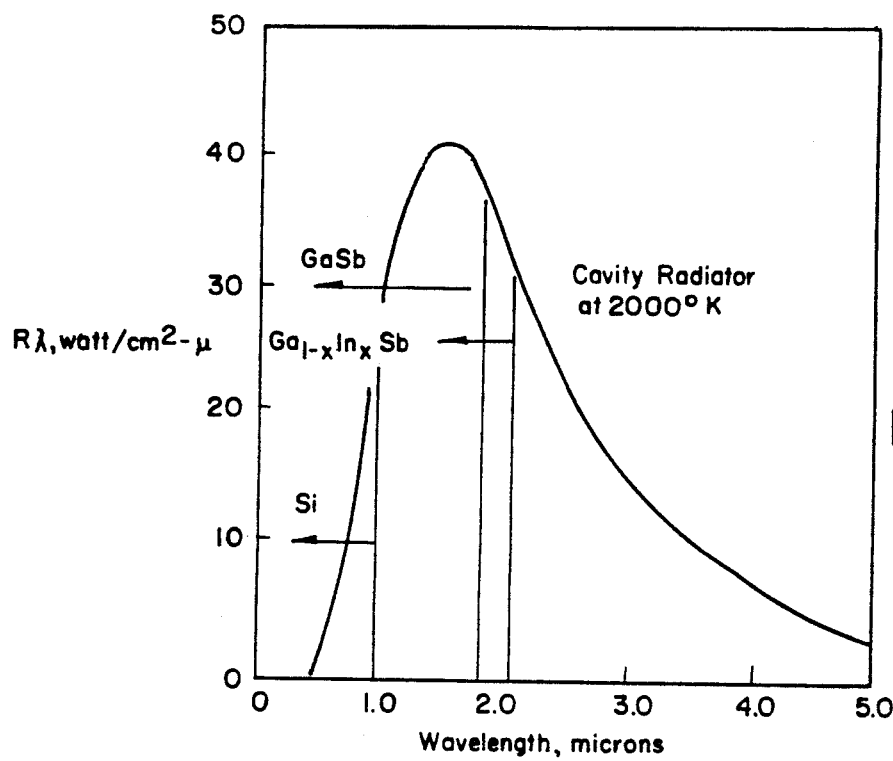
FIG. 1 shows the radiated infrared power as a function of wavelength for a black body emitter at 2000 K, the upper limit of the temperature range of practical interest.

FIG. 1 shows the radiated infrared power as a function of wavelength for a black body emitter at 2000 K, the upper limit of the temperature range of practical interest. As noted, silicon absorbs energy weakly unless the wavelength is well below 1.1 $\mu$m; GaSb strongly absorbs energy for wavelengths in the region below 1.8 $\mu$m; and $Ga_{0.9}In_{0.1}Sb$ strongly absorbs energy for wavelengths below 2.0 $\mu$m.

FIG. 1 provides information for choosing TPV cell and IR emitter materials. Referring to FIG. 1, the radiation energy from a black body at 2000 K (1727° C.) peaks at about 1.45 $\mu$m. This means that silicon with an indirect band gap of 1.1 $\mu$m absorbs very little IR radiation from this source, while GaSb and $Ga_{0.9}In_{0.1}Sb$ with direct bandgaps at 1.8 and 2.0 $\mu$m, respectively, absorb much more of the IR energy.

The emitter could be made of an iron-chrome-nickel-cobalt alloy, but corrosion and strength considerations would limit its peak operating temperature to about 1300 K. Ceramic emitters would permit operation at higher temperatures which will give much higher radiation energy fluxes (see FIG. 7) and greatly increase the output of the photovoltaic cells, thus reducing their cost per unit of electrical output. High temperature ceramic tubing is available in alumina, mullite, and silicon carbide so that these materials are good candidates for a high temperature IR emitter. The highest recommended static operating temperature for alumina and mullite is 2000 K, but these materials have a relatively low emissivity. A coating of another ceramic might be applied to increase the emissivity; Ref. 10 includes a review of investigations of such materials with a high emissivity in the infrared. The peak practicable operating temperature for a long life of silicon carbide is a bit lower than for alumina or mullite, i.e., about 1700 K, but it is much superior to either alumina or mullite in that both the emissivity and thermal conductivity are much higher and it has much greater resistance to thermal shock (a major problem in high temperature equipment such as gas turbines, e.g., see Ref. 11), hence it is the preferred emitter material. A more conservative temperature to give a long operating lifetime might be 1500 K, in which case $Ga_{0.9}In_{0.1}Sb$ becomes the preferred TPV material.

Figure 2:
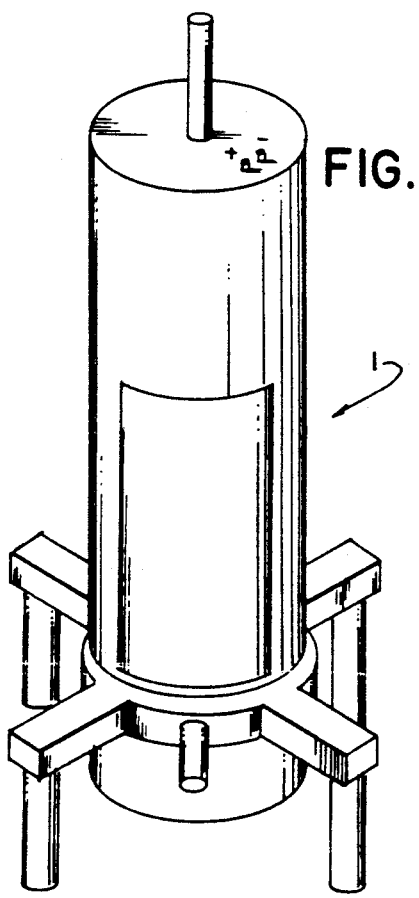
FIG. 2 shows a perspective view of the quiet, compact, DC electric power generator described in detail herein.

FIG. 2 shows a perspective view of the quiet, compact, DC electric power generator described in detail herein. The unit is cylindrical. Hydrocarbon fuel and air are supplied at the bottom to provide radiant energy which is converted to DC electric power using photovoltaic cells. Exhaust gases exit at the top. This unit is 5 to 8 in. in diameter and 18 to 30 in. high.

FIG. 2 shows a TPV generator 1 from the user's point of view. This unit is designed to be a small, quiet, lightweight electric power supply for e.g. a remote mountain cabin in the Pacific Northwestern U.S. As such, it is designed to run on propane, butane, or natural gas, and to provide electric power for a refrigerator, evening light, and color TV. We have determined that this translates to 50 W for the refrigerator (Model DC 254 Norcold), 50 W for the light, and 70 W for the TV (13 in. Panasonic Color AC/DC), or 170 W total. Given this information, we decided to design a 300 W basic unit. As will be evident later, the design power output can be increased simply by increasing the number, length, or width of the cell strings.

Figure 3:
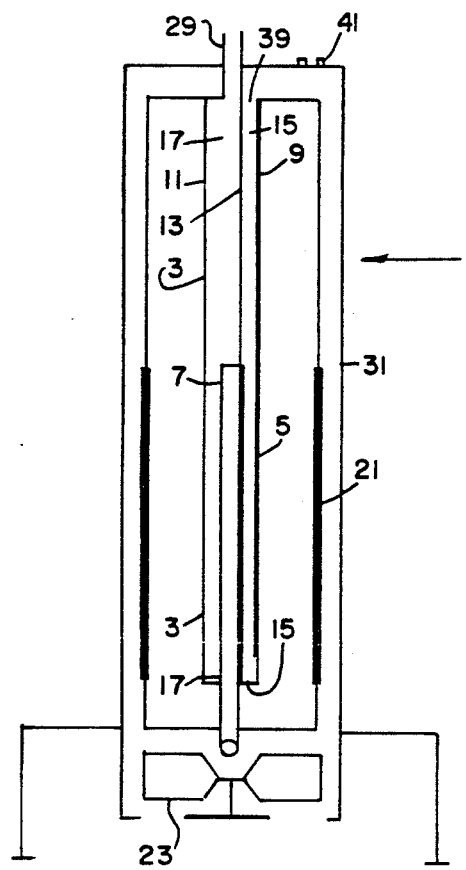
FIG. 3 shows the side view cross section of the unit in FIG. 2.

FIGS. 3, 4, and 5 show detailed cross sections through a TPV generator 1.

FIG. 3 shows the side view cross section of the unit in FIG. 2. The fuel and air are burned inside a vertical emitter tube located at the center of the cylinder. IR energy emitted by this unit is absorbed by the GaSb TPV cell strings and converted to electric power. Air supplied by the fan at the bottom of the unit first passes upward behind the cells for cooling and then enters the air supply tubes at the top of the regenerator/burner. Locations for the horizontal cross sections through the burner are shown in FIG. 4 and the top of the regenerator is shown in FIG. 5.

A burner/emitter/regenerator is located at the center of the unit along the vertical cylindrical axis. The lower end of a silicon carbide tube 3 (possibly as small as 1.3 in. OD and 16 in. long) forms the IR emitter 5 and encloses the burner 7 while the upper end 9 of the same tube 3 encloses the regenerator 11. Fuel is injected from the bottom end into a smaller closed end burner tube 7 (possibly as small as 0.375 in. OD and 8 in. long). A hole pattern is drilled in the wall of this burner tube 7 and tailored for an optimal temperature profile along the length of the emitter tube 5. In this layout, at the top of the silicon carbide tube 3 air enters three alumina air supply tubes 13 symmetrically located around the central burner tube 7. These air supply tubes are cut at an angle at their bottom ends 15 to feed secondary air to the bottom 17 of the burner 7. As the supply air passes downward in the upper section of the silicon carbide tube 3, it is heated by the hot exhaust gases. Hence the upper section of the silicon carbide tube 3 becomes the outer wall of the regenerator 11. As the hot secondary air at the bottom of the burner rises, it mixes with the fuel which burns in the interstices or channels between the air supply tubes. The resultant multiplicity of small flames heat the silicon carbide emitter tube 3 to the 1800 K design value. At this temperature, the emitter radiates 60 W/cm$^2$ of IR power.

The diameter of the emitter tube 3 is a design variable. A smaller diameter emitter provides a better approximation to the ideal IR line source so that the reflector panels 19 can direct a greater fraction of the IR energy onto the cell strings 21 on the first reflection (see FIG. 4). Thus the smaller the diameter of the emitter, the larger the fraction of the IR going to the cells and the smaller the fraction recycled back to the emitter or lost to heating the reflector panels. On the other hand, the smaller the diameter of the emitter, the greater the pressure drop through the combustion zone and the greater the problems in getting good combustion conditions, particularly in the course of light-off and start-up. Inasmuch as a flame-out under start-up conditions is not only annoying but hazardous, the combustion chamber should have sufficient volume to provide a wide margin of safety from flame-out, so that this will be the dominant consideration rather than the efficiency of utilization of the IR radiation from the emitter. In the design shown in FIGS. 2 through 5 the emitter OD would be from 1.3 to 2.0 in. However, all stable and functional burner/emitter diameters are to be included within the spirit of this invention. The many interdependent problems inherent in the burner are so complex and subtle (see Ref. 12) that extensive development tests will be required to obtain a suitable set of proportions for the burner/emitter/regenerator unit.

FIG. 4 shows a horizontal cross section through the burner/radiator/TPV cell region. Fuel is supplied through small ports in the burner tube 7 located at the center of the emitter tube 3. Small air supply tubes 13 are symmetrically located in the annulus around the burner tube 3. These tubes are cut at an angle at their bottom end 15 to supply heated air to the bottom of the burner. As this air rises, it provides oxygen to the flames in the combustion region. Some of the IR radiation from the emitter hits the TPV cells directly, but the TPV cells occupy only a small fraction of the perimeter in which they lie. A set of reflector panels is provided to deflect much of the radiation going into the region between the cells so that it impinges on the TPV cells. The greater part of the balance is reflected back onto the emitter through a series of multiple reflections. Air is passed upward from the fan through cooling channels behind the TPV cells. Flashlight batteries are provided to run the fan during start-up.

Still referring to FIG. 4, the emitter 5 is surrounded by a reflector 19, and the TPV cell strings 21 are mounted in the small gaps 25 between reflector panels 27. For perfect reflectors, this situation can be modeled as a black body cavity where the cells are looking in at radiation from an 1800 K source. In this case, the IR power arriving at the cell surface is 60 W/cm$^2$. For a GaSb cell, 17 W/cm$^2$ will be absorbed and 43 W/cm$^2$ will be reflected back to the emitter.

Of the 17 W/cm$^2$ absorbed, 6.6 W/cm$^2$ is converted to electricity for an ideal conversion efficiency of 39%. For a perfect reflector, the shape of the reflector is not important. However, for practical reflectors, it will help to shape the reflectors to concentrate the IR energy to the cells with as few reflections as possible.

Besides the efficiency loss in the cell, there will also be heat losses up the stack 29 and heat losses through air to the outer cylinder walls 31. These losses will be reduced by using a longer regenerator. Again referring to FIG. 4, the TPV generator cylinder 33 actually consists of two concentric cylindrical shells 31, 35 with the cells mounted on the inner surface of the inner shell 35. The spaces between the two cylinders allow for cooling air to pass up to the regenerator entrance 39. This outer air flow serves both to cool the cells 21 and to prevent the outer shell walls 31 from getting hot to the touch, an important function from the safety standpoint. The space 37 between cylinders also provides for safe wiring from the TPV cell strings 21 to the electrical terminal outlet 41.

FIG. 5 shows a horizontal cross section through the top of the regenerator. As noted, the cool air rising up in the channels behind the cells then enters downward at the top of the regenerator where it is heated by the exhaust gases rising upward from the burner.

FIG. 6 shows top, side, and end views of the TPV cell string assembly. Rectangular cells are connected in series to a line receiver. The cells are bonded to one face of a cooling channel or chimney. The bond is thermally conducting but electrically insulating. A multipane window is located radially inward from the cell string to limit heat transfer by hot air from the emitter. The face of this window is coated to reflect radiation longer than 2 μm back to the emitter while passing shorter wavelengths on to the TPV cells.

Finally, FIG. 6 shows the design of a GaSb TPV cell string 21. The GaSb cells 43 are 1 cm wide and 0.4 cm long. For an emitter at 1800 K, each cell produces 2.2 W. A cell string 8 in. long will contain 33 cells and will produce 75 W at 14 V and 5.3 amps. The TPV generator unit represented in FIG. 4 has 4 cell strings which will generate 300 W. These cell strings can be wired to generate 12, 24, or 48 V. Batteries 45 are provided to operate the fan during start-up. The fan may consume as little as 1 W if the air passages are sufficiently large.

Figure 7:
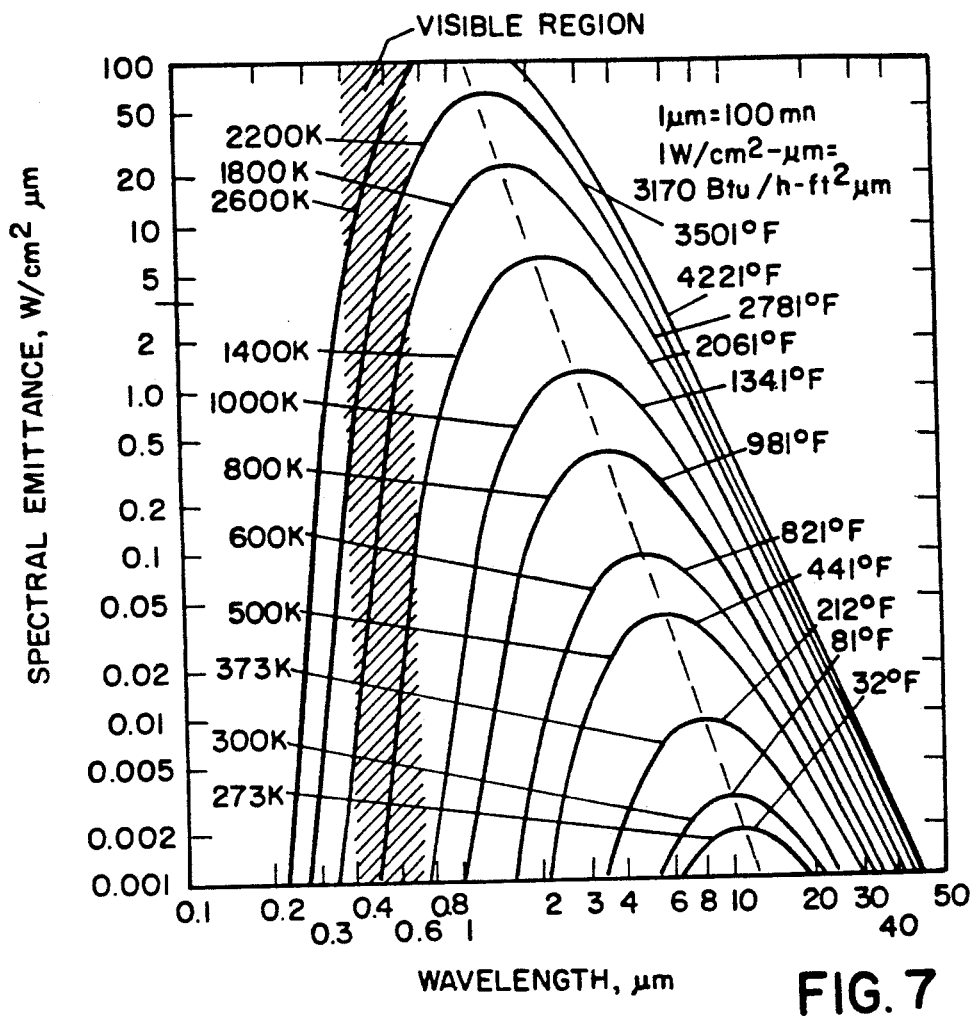
FIG. 7 shows the Black-body spectral intensities for source temperatures between 273 and 2600 K.

FIG. 7 shows the spectral intensities for source temperatures between 273 and 2600 K. The dashed line indicates the position of radiation peaks. The shaded area is the region of visible wavelengths.

Figure 8:
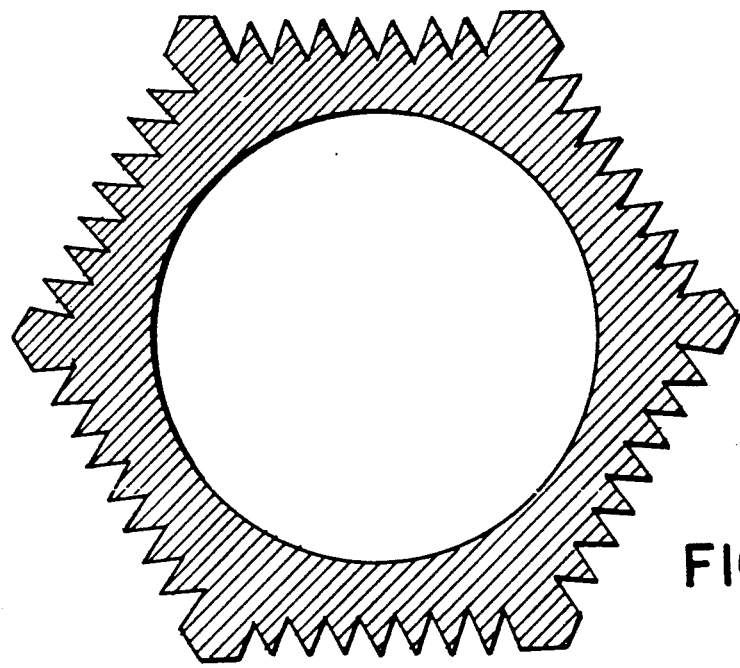
FIG. 8 shows a section through an emitter for a unit with 6 strings of TPV cells.

FIG. 8 shows the section through the emitter for a unit having 6 strings of TPV cells. The axial grooves increase the emissivity and partially columnate the radiation.

The dimensions and operating parameters cited herein are intended only to be exemplary. Various changes and alterations may be made to meet the requirements of particular applications without parting from the spirit of the invention disclosed herein. All changes and modifications which fall within the scope of the claims and equivalents thereof are intended to be embraced thereby.

REFERENCES

1. A. P. Fraas, "Heat Exchanger Design," 2nd ed., John Wiley & Sons, 1989.
2. A. P. Fraas, "Engineering Evaluation of Energy Systems," McGraw-Hill, Inc., 1982.
3. D. G. Pelka, A. Santos, and W. W. Yuen, Proceedings of the 32nd International Power Sources Symposium of the Electrochemical Society, pp. 110–123, Cherry Hill, N.J., 1986.
4. U.S. Pat. No. 4,976,606 A.
5. L. M. Fraas, U.S. Pat. No. 5,096,505, 1989.
6. M. D. Morgan, W. E. Horne, and A. C. Day, Radioisotope Thermal Power Plant Application of GaSb Solar Cells, NASA, SPRAT Conference, 1989.
7. O. L. Doellner, "Aircraft Photovoltaic Power-Generating System," PhD Thesis, University of Arizona, 1991.
8. A. P. Fraas, "Design and Development Tests of Direct-Condensing Potassium Radiators," AIAA Specialists Conference on Rankine Space Power Systems, vol. 1, USAEC Report CONF-651026, October, 1965.
9. J. W. Tester, R. M. Mayer, and A. P. Fraas, "Comparative Performance Characteristics of Cylindrical Parabolic and Flat Plate Solar Energy Collectors," ASME Paper 74-WA/Ener-3, Winter Annual Meeting, Nov. 17-22, 1974.
10. A. P. Fraas, "Effects of Directed and Kinetic Energy Weapons on Spacecraft," ORNL/TM-9814, Oak Ridge National Laboratory, December, 1986.
11. A. P. Fraas, "Summary of the research and Development Effort on Ceramic Gas Turbines," ORNL/TM-6255, Oak Ridge National Laboratory, 1977.
12. E. D. Howe and H. G. Johnson, "The Characteristics of Atmospheric-Type Burners When Used with Natural Gas," ASME Trans., 1940, pp. 673–677.

We claim:

1. A thermophotovoltaic generating method comprising:
   combusting a hydrocarbon fuel and air mixture producing a flame and infrared energy in a central coaxial burner-emitter-regenerator;
   partially surrounding the burner-emitter-regenerator by linear parallel thermophotovoltaic cell strings facing the burner-emitter-regenerator and increasing the flame temperature for providing increased efficiency utilization of the energy from the fuel and producing an increased amount of infrared energy;
   receiving infrared energy from the emitters and converting the infrared energy to DC electric power in the thermophotovoltaic cell strings;
   surrounding the burner-emitter with plural reflector panels except for spaces occupied by the thermophotovoltaic cell strings, thereby directing the infrared energy emanating radially from the emitter, reflecting the energy from the reflector panels and concentrating the infrared energy on the cell strings; and
   providing a uniform infrared energy along the length of each photovoltaic cell string from the burner-emitter and the reflector.

2. The thermophotovoltaic generating method of claim 1 wherein the cells in the strings are $Ga_{1-x}In_xSb$ cells where x is a value between 0 and 0.2.

3. The thermophotovoltaic generating method of claim 1 further comprising supplying cooling air to the cell strings and supplying air to the burner-emitter-regenerator by means of a fan.

4. A thermophotovoltaic generator having a linear burner-emitter-regenerator comprising a lower burner-emitter section and an upper regenerator section, wherein the burner-emitter section comprises an outer emitter tube and a coaxial inner burner tube having a smaller diameter than the outer tube, the inner tube having a closed top end and an open bottom end for fuel supply, the burner tube having an array of fuel discharge ports for producing flame jets, the ports being arranged along the length of the burner tube in a pattern for providing a tailored temperature profile along a length of the emitter tube for providing a uniform infrared energy output along the length of the emitter tube, wherein combustion air and fuel velocities are sufficiently low to avoid flame-outs, and wherein the flame jet ports are sufficiently small, and operating temperatures of the burner tube are sufficiently low, and volume of primary air supplied with the fuel is sufficiently low to avoid flame flashback into the burner tube.

5. The thermophotovoltaic generator of claim 4 wherein an annular space between the inner burner tube and the outer emitter tube is divided into first and second sets of passages, with secondary combustion air passing downward through the first set of passages and back upward in the second set of passages minimizing heat losses and for minimizing structural complexity, wherein the fuel ports in the burner tube are provided for feeding small flames spaced along lengths of the first and second sets of passages for providing a desired heat input distribution.

6. The thermophotovoltaic generator of claim 5 further comprising a secondary combustion air inlet at a top of the regenerator section connected to a third set of passages in the regenerator section for feeding secondary combustion air through the regenerator section to the firs set of passages and a fourth set of passages in the regenerator section for exhaust gases for heating the air in the third set of passages with the exhaust gases exiting from the fourth set of passages and passing upward in the fourth set of passages in the regenerator section.

7. A thermophotovoltaic generator having a linear burner-emitter-regenerator comprising a lower burner-emitter section and an upper regenerator section, wherein the burner-emitter section comprises an outer emitter tube and a coaxial inner burner tube having a smaller diameter than the outer tube, the inner tube having a closed top end and an open bottom end for fuel supply, the burner tube having an array of fuel discharge ports for producing flame jets, the ports being arranged along the length of the burner tube in a pattern for providing a tailored temperature profile along a length of the emitter tube for providing a uniform infrared energy output along the length of the emitter rube, wherein combustion air and fuel velocities are sufficiently low to avoid flame-outs, and wherein the flame jet ports are sufficiently small, and operating temperatures of the burner tube are sufficiently low, and volume of primary air supplied with the fuel is sufficiently low to avoid flame flashback into the burner tube, wherein the emitter tube comprises a silicon carbide tube having a wall thickness for providing heat conduction both circumferentially and axially and for avoiding local temperature spikes otherwise resulting from impingement of individual jets of flame.

8. A thermophotovoltaic generator having a linear burner-emitter-regenerator comprising a lower burner-emitter section and an upper regenerator section, wherein the burner-emitter section comprises an outer emitter tube and a coaxial inner burner tube having a smaller diameter than the outer tube, the inner tube having a closed top end and an open bottom end for fuel supply, the burner tube having an array of fuel discharge ports for producing flame jets, the ports being arranged along the length of the burner tube in a pattern for providing a tailored temperature profile along a length of the emitter tube for providing a uniform infrared energy output along the length of the emitter tube, wherein combustion air and fuel velocities are sufficiently low to avoid flame-outs, and wherein the flame jet ports are sufficiently small, and operating temperatures of the burner tube are sufficiently low, and volume of primary air supplied with the fuel is sufficiently low to avoid flame flashback into the burner tube, further comprising axial grooves on a surface of the emitter tube for increasing emissivity and for partially columnating infrared energy from the emitter tube for directing rays of infrared energy predominantly in a radial direction rather than isotropically.

9. The thermophotovoltaic generator of claim 8 wherein the burner tube has a polygonal surface with a number of sides being equal to a number of the cell strings.

10. A thermophotovoltaic generator having a linear mounted series-parallel connected photovoltaic cell string assembly comprising a heat sink having first and second opposite surfaces, a plurality of strings of photovoltaic cells responsive in the infrared region to wave lengths at least as long as 1.7 $\mu$m wherein the cells are mounted on the first surface of the heat sink and wherein the second surface of the heat sink has plural fins for cooling of said cells, further comprising an infrared energy emitter for radiating energy to the cells, a multipane window mounted in front of the cells between the emitter and the cells for reducing heat transfer by thermal convection of hot air from the emitter, said window having a coating for reflecting infrared energy with wavelengths longer than 2 $\mu$m and for transmitting shorter useful wavelengths.

11. A thermophotovoltaic generator comprising a central coaxial burner and an emitter surrounding the burner, plural linear parallel thermophotovoltaic cell strings partially surrounding and facing the burner for converting infrared energy received from the burner to DC electric power, a hydrocarbon fuel and air mixture source connected to the burner, a regenerator connected to the burner for increasing the temperature of the flame from the burner, for increasing efficiency of utilization of energy from the fuel, for increasing the amount of infrared energy radiated from the emitter to the photovoltaic cells, for increasing output of the cells and for reducing cost per watt of cell electrical output, further comprising reflector panels partially surrounding the emitter except for the spaces occupied by the thermophotovoltaic cell strings for directing the infrared energy emanating radially from the burner-emitter and concentrating the energy on the cell strings and for providing uniform infrared energy along a length of each photovoltaic cell string.

12. A process for power generation using a thermophotovoltaic generator having a central coaxial burner-emitter-regenerator partially surrounded by linear parallel thermophotovoltaic cell strings facing the burner-emitter-regenerator, reflector panels partially surrounding the burner-emitter-regenerator except for the spaces occupied by the thermophotovoltaic cell strings, comprising the steps of:
a) combusting a hydrocarbon fuel and air mixture to provide energy for the burner-emitter-regenerator and for generating infrared radiation;
b) supplying infrared radiation with wavelengths at least as long as 1.7 $\mu$m from the emitter to the cell strings;
c) reflecting and concentrating the infrared radiation emanating radially from the emitter by the reflector panels on the cell strings;
d) providing a uniform infrared radiation along the length of each photovoltaic cell string;
e) providing combustion air through the regenerator;
f) increasing temperature of flame from the burner;
g) increasing efficiency in utilization of energy from the fuel; and
h) increasing infrared radiation to the photovoltaic cells, for increasing output of the cells and reducing cost per watt of cell electrical output.

13. The process of claim 12 further comprising supplying cooling air from a fan to the thermophotovoltaic cell strings and supplying the air to the regenerator and then to the burner.

* * * * *